United States Patent
Zhao et al.

(10) Patent No.: US 10,978,784 B2
(45) Date of Patent: Apr. 13, 2021

(54) ELECTRONIC APPARATUS AND INFORMATION PROCESSING METHOD

(71) Applicant: Lenovo (Beijing) Co., Ltd., Beijing (CN)

(72) Inventors: Qian Zhao, Beijing (CN); Heng Liu, Beijing (CN)

(73) Assignee: LENOVO (BEIJING) CO., LTD., Beijing (CN)

( * ) Notice: Subject to any disclaimer, the term of this patent is extended or adjusted under 35 U.S.C. 154(b) by 285 days.

(21) Appl. No.: 16/139,349

(22) Filed: Sep. 24, 2018

(65) Prior Publication Data

US 2019/0115649 A1 Apr. 18, 2019

(30) Foreign Application Priority Data

Sep. 22, 2017 (CN) .......................... 201710865324.5

(51) Int. Cl.
*G01R 27/26* (2006.01)
*H01Q 1/24* (2006.01)
(Continued)

(52) U.S. Cl.
CPC ............ *H01Q 1/243* (2013.01); *H01Q 1/245* (2013.01); *H01Q 21/28* (2013.01); *H03K 17/955* (2013.01); *H04B 1/1027* (2013.01); *H04B 1/3838* (2013.01); *H03K 2017/9613* (2013.01); *H04L 5/14* (2013.01)

(58) Field of Classification Search
CPC ........... G01R 27/26; H01Q 1/24; H01Q 21/28
See application file for complete search history.

(56) References Cited

U.S. PATENT DOCUMENTS

2008/0047764 A1* 2/2008 Lee .................. G06F 3/0443
178/18.06
2011/0012793 A1* 1/2011 Amm .................. H01Q 1/245
343/702
(Continued)

FOREIGN PATENT DOCUMENTS

CN 101458565 A 6/2009
CN 102484316 A 5/2012
(Continued)

*Primary Examiner* — Patrick Assouad
*Assistant Examiner* — Taqi R Nasir
(74) *Attorney, Agent, or Firm* — Anova Law Group, PLLC

(57) ABSTRACT

An electronic apparatus and an information processing method are provided. The apparatus includes a main body, a first electronic component and a second electronic component, having a common function and disposed at different positions in relation to the main body, and a controller, disposed in relation to the main body. The controller is connected to the first electronic component through a first connection wire and the controller is also connected to the second electronic component through a second connection wire. The first connection wire has a length longer than the second connection wire. The apparatus further includes a reference wire, connected to the controller, in order to provide reference data corresponding to the first connection wire to the controller. The controller is configured to adjust detection data received from the first electronic component via the first connection wire, based on the reference data of the reference wire.

19 Claims, 6 Drawing Sheets

(51) Int. Cl.
*H03K 17/955* (2006.01)
*H04B 1/10* (2006.01)
*H01Q 21/28* (2006.01)
*H04B 1/3827* (2015.01)
*H04L 5/14* (2006.01)
*H03K 17/96* (2006.01)

(56) References Cited

U.S. PATENT DOCUMENTS

| | | | |
|---|---|---|---|
| 2012/0026123 A1* | 2/2012 | Grunthaner | G06F 3/0418 345/174 |
| 2012/0050218 A1 | 3/2012 | Chu et al. | |
| 2012/0092231 A1 | 4/2012 | Liu et al. | |
| 2014/0369511 A1 | 12/2014 | Sheerin et al. | |
| 2015/0011273 A1* | 1/2015 | Wilmhoff | H04M 1/00 455/575.7 |

FOREIGN PATENT DOCUMENTS

| | | |
|---|---|---|
| CN | 102594994 A | 7/2012 |
| CN | 102646861 A | 8/2012 |
| CN | 102789590 A | 11/2012 |
| CN | 202602758 U | 12/2012 |
| CN | 103929538 A | 7/2014 |
| CN | 104182576 A | 12/2014 |
| CN | 104269605 A | 1/2015 |
| CN | 104345876 A | 2/2015 |
| CN | 105870595 A | 8/2016 |
| CN | 106159444 A | 11/2016 |
| CN | 106462220 A | 2/2017 |
| JP | 2012227819 A | 11/2012 |
| TW | 201209694 A | 3/2012 |
| WO | 2014025510 A1 | 2/2014 |

* cited by examiner

ELECTRONIC APPARATUS AND INFORMATION PROCESSING METHOD

CROSS-REFERENCES TO RELATED APPLICATIONS

This application claims the priority of Chinese Patent Application No. 201710865324.5, filed on Sep. 22, 2017, the entire contents of which are incorporated herein by reference.

FIELD OF THE DISCLOSURE

The present disclosure generally relates to the field of temperature compensation technology and, more particularly, relates to an electronic apparatus and an information processing method.

BACKGROUND

Currently, some smart phones often include the standardized SAR (Specific Absorption Rate) sensor design to comply with the nascent 2018 SAR certification standard. According to this standard, a capacitive proximity (CAP) sensor needs to be configured on the top and bottom of the smart phone body, respectively, to detect the proximity of the human body.

For cost optimization, one IC chip (controller chip) may connect to both the top and bottom capacitive proximity sensors to process the data captured from both sensors and perform proper control functions on the smart phone based on the data processing results. The capacitive proximity sensor design requires a connection wire as short as possible in the smart phone or other similar apparatus. A long connection wire may degrade signal quality due to temperature change. When both capacitive proximity sensors are connected to and controlled by one controller chip, the controller chip is often located close to one of the capacitive proximity sensors and distanced from the other. It is inevitable to have a long sensor connection wire in the layout. When the controller chip collects the sensor data through the long connection wire, the accuracy of the collected sensor data may be degraded due to temperature change, thereby degrading the performance of the controller chip.

The disclosed electronic apparatus and information processing method are directed to solve one or more problems set forth above and other problems in the art.

BRIEF SUMMARY OF THE DISCLOSURE

One aspect of the present disclosure provides an electronic apparatus. The apparatus includes a main body, a first electronic component and a second electronic component, having a common function and disposed at different positions in relation to the main body, and a controller, disposed in relation to the main body. The controller is connected to the first electronic component through a first connection wire and the controller is also connected to the second electronic component through a second connection wire. The first connection wire has a length longer than the second connection wire. The apparatus further includes a reference wire, connected to the controller, in order to provide reference data corresponding to the first connection wire to the controller. The controller is configured to adjust detection data received from the first electronic component via the first connection wire, based on the reference data of the reference wire.

Another aspect of the present disclosure provides an information processing method. The method includes connecting a first electronic component to a controller through a first connection wire and connecting a second electronic component to the controller through a second connection wire. The first connection wire has a length longer than the second connection wire. A reference wire is connected to the controller, in order to provide reference data corresponding to the first connection wire to the controller. The controller obtains detection data from the first electronic component through the first connection wire and adjusts the detection data received from the first electronic component using the reference data of the reference wire.

Other aspects of the present disclosure can be understood by those skilled in the art in light of the description, the claims, and the drawings of the present disclosure.

BRIEF DESCRIPTION OF THE DRAWINGS

To more clearly illustrate the technical solution in the present disclosure, the accompanying drawings used in the description of the disclosed embodiments are briefly described hereinafter. Obviously, the drawings described below are merely some embodiments of the present disclosure. Other drawings may be derived from such drawings by a person with ordinary skill in the art without creative efforts and may be encompassed in the present disclosure.

DETAILED DESCRIPTION

To make the foregoing objectives, features and advantages of the present disclosure clearer and more understandable, the present disclosure will be further described with reference to the accompanying drawings and embodiments. However, exemplary embodiments may be embodied in various forms and should not be construed as limited to the embodiments set forth herein. Rather, these embodiments are provided to fully convey the thorough and complete concepts of the exemplary embodiments to those skilled in the art.

The present disclosure provides an electronic apparatus and an information processing method of the electronic apparatus.

Figure 1:
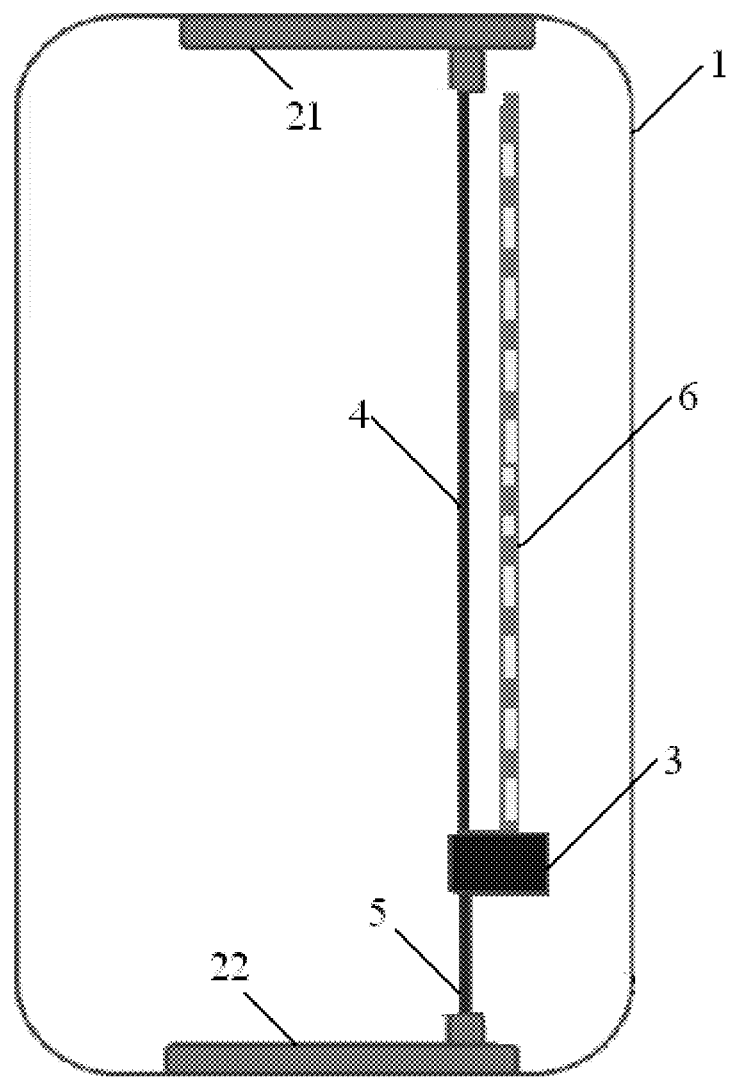
FIG. 1 illustrates a schematic diagram of an example of an electronic apparatus according to some embodiments of the present disclosure.

The electronic apparatus may be, but is not limited to, a smart phone, a tablet computer, or other terminal apparatus. FIG. 1 illustrates a schematic diagram of an example of an electronic apparatus according to some embodiments of the present disclosure. As shown in FIG. 1, the electronic apparatus includes a main body 1, two electronic components 21, 22 having a common function, a controller 3, and a reference wire 6.

The main body 1 may be, but is not limited to, a main body of a smart phone, a tablet computer, or other terminal apparatus. For example, the main body 1 may include at least the main board coupled to a smart phone, a tablet computer, or other terminal apparatus.

The two electronic components 21, 22 having the common function may be coupled to, e.g., disposed on, the main body 1 in different positions.

The two electronic components 21, 22 have the common function and may be components designed and operated in pair in the electronic apparatus, although more than two electronic components may be included in the electronic apparatus.

For example, the two electronic components 21, 22 may be two capacitive proximity sensors to detect the proximity of the human body. In another example, the two electronic components 21, 22 may be two cameras for image acquisition. Cameras may be disposed on the top and bottom of the main body 1, respectively, to capture complete face images through both cameras, or to emulate human eyes to capture images with a wider viewing angle. In another example, the two electronic components 21, 22 may be two microphones to capture audio signals.

For illustrative purposes, two sensors are used as an example in the description according to various embodiments of the present disclosure.

The two electronic components 21, 22 may be disposed at different positions in relation to the main body. For example, one may be disposed on the top and the other may be disposed on the bottom, although the positions are not limited in the present disclosure. In some applications, the actual positions of the two electronic components 21, 22 may be determined based on the layout requirement in combination with the industrial design of the main body 1.

The two electronic components 21, 22 include a first electronic component 21 and a second electronic component 22. Coupled to the main body 1, the controller 3 is connected to the first electronic component 21 through a first connection wire 4 and connected to the second electronic component 22 through a second connection wire 5. The first connection wire 4 is longer than the second connection wire 5. As disclosed herein, the wires, such as connections wires and/or reference wires may include signal traces on a printed circuit board (PCB).

In the scenario of paired design and application of the electronic components, such as paired sensors (e.g., CAP sensors), paired cameras, or paired microphones in the smart phone or tablet computer, cost optimization and space saving (e.g., main board layout space saving) often result in using one controller to simultaneously control the two electronic components. That is, one controller collects detection data from both electronic components and performs the respective processing/controlling operations based on the detection data from each electronic component.

In practical applications, one controller may simultaneously connect to both electronic components, and often the controller is not disposed at the middle position between the two electronic components. For example, the two electronic components are two capacitive proximity sensors. Because of the design of the capacitive proximity sensor, it is desired to keep the connection wires as short as possible in the smart phone. Long connection wires may degrade signal quality due to the temperature change. Thus, the controller is often disposed close to one electronic component to reduce the impact of the temperature change on the connection wire. On the other hand, the controller is disposed distanced from the other electronic component. Accordingly, the connection wire between the controller and the other electronic component has to be longer. Due to the longer connection wire between the controller and the other electronic component, the connection wire connecting the controller to the other electronic component distanced from the controller may be affected by the temperature change and subject to a certain capacitance effect, thereby lowering the accuracy of the detection data collected by the electronic component through the longer connection wire.

The present disclosure is directed to solve at least the technical problem set forth, for example, at least in the above application scenario involving two electronic components having the common function. In various embodiments of the present disclosure, the electronic apparatus includes a controller and two electronic components connected to the controller. As shown in FIG. 1, the controller 3 connects to the first electronic component 21 through the first connection wire 4 and the second electronic component 22 through the second connection wire 5. The first connection wire 4 is longer than the second connection wire 5.

Referring to FIG. 1, a reference wire 6 is connected to the controller 3. The reference wire 6 is laid-out along a wiring direction of the first connection wire 4, and has a same length as the first connection wire 4. The controller 3 collects reference data through the reference wire 6.

As shown in FIG. 1, to compensate the temperature change of the long connection wire of the electronic component, the present disclosure provides the reference wire 6 that is laid-out along a wiring direction of the first connection wire 4 and connected to the controller 3. The reference wire 6 has a same length as the first connection wire 4. The reference wire collects the reference data, such as the reference capacitance. Thus, the reference data collected by the reference wire 6 may be processed to provide the temperature compensation to the detection data collected by the first electronic component 21.

For illustrative purposes, in one example, the two electronic components may be two sensors. The reference data collected by the reference wire may be processed to provide the temperature compensation to the detection data collected by the sensor connected through the longer connection wire. In another example, the two electronic components may be two cameras. The reference data collected by the reference wire may be processed to provide the temperature compensation to the image detection data collected by the camera connected through the longer connection wire. In another example, the two electronic components may be two microphones. The reference data collected by the reference wire may be processed to provide the temperature compensation to the audio detection data collected by the microphone connected through the longer connection wire.

The present disclosure provides an electronic apparatus. The electronic apparatus may include a main body, two electronic components having a common function and disposed at different positions of the main body, a controller connected to a first electronic component through a first connection wire and connected to a second electronic component through a second connection wire shorter than the first connection wire, and a reference wire connected to the controller, laid-out along a wiring direction of the first connection wire, having the same length as the first connection wire, and collecting reference data. The present disclosure provides the reference wire laid-out along a wiring direction of the longer connection wire of the electronic component, having the same length as the longer connection wire, and collecting reference data. Thus, the embodiments of the present disclosure provide the temperature compensation to the detection data collected by the first electronic component based on the reference data collected by the reference wire, and effectively improves the accuracy of the detection result of the electronic component connected by the longer connection wire.

The reference wire is added to the main body of the electronic apparatus to collect the reference data that is consistent with the noise data, for example, due to the temperature change, collected through the first connection wire. The first connection wire is the longer connection wire. The reference data are considered as a measurement of the noise data collected through the first connection wire. Thus, the temperature compensation may be provided to the first electronic component corresponding to the first connection wire.

In some embodiments, to keep the reference data collected by the reference wire as consistent as possible with the noise data collected by the first connection wire, the reference wire may be laid synchronously in parallel with the first connection wire on the main body (e.g., both are laid synchronously in parallel on the main board of the electronic apparatus), and both are connected to the controller.

The reference wire has the same length as the first connection wire, and is kept in a bare wire state. The bare wire state of the reference wire refers to that the end of the reference wire not connected to the controller is a free end, and not connected to any electronic component. No electronic component is connected to any portion of the reference wire. The length and layout of the reference wire is substantially consistent with the first connection wire. Thus, the reference data collected by the reference wire is substantially consistent with the noise data collected by the first connection wire, thereby increasing the reference value of the reference data collected by the reference wire.

In embodiment three of the present disclosure, the controller obtains the detection data of the first electronic component from the first connection wire and the reference data from the reference wire, and compensates the detection data of the first electronic component using the reference data.

After the controller obtains the detection data of the first electronic component from the first connection wire, the detection data may include two portions: the detection data collected by the first electronic component and the noise data collected by the reference wire. The detection data is a result of mixing the two portions. Because the extra reference wire collects the reference data consistent with the noise data collected by the first connection wire, the controller may calculate a difference between the value of the detection data (including the noise data) of the first electronic component and the value of the reference data to compensate the detection data of the first electronic component obtained by the controller. The compensated detection result may be the actual detection data of the first electronic component.

For illustrative purposes, in one example, the two electronic components may be two sensors. Assuming that the first electronic component is a first sensor and the second electronic component is a second sensor, the controller may obtain the capacitance value corresponding to the capacitance data (including noise) of the first sensor and the capacitance value corresponding to the reference data, calculate a difference, and obtain the compensated capacitance value of the first sensor. Thus, the accuracy of the detection result of the electronic component having the longer connection wire may be effectively improved. The controller may perform the corresponding operation (the first operation) on the electronic apparatus based on the substantially accurate compensated detection result.

In another example, the two electronic components may be two capacitive proximity sensors. The compensated sensor capacitance value may be used to detect the proximity of the human body. After it is determined that the human body is in the proximity of the electronic apparatus, the transmit power of the RF (radio frequency) antenna corresponding to the sensor may be reduced (to a permissible range), or the RF signal may be transmitted by switching to the antenna disposed distanced from the human body. In another example, as shown in FIG. 1, assuming that the compensated detection result of the capacitive proximity sensor disposed on the top of the electronic apparatus indicates the proximity of the human body, the transmit power of the antenna disposed on the top of the electronic apparatus may be reduced, or the RF signal transmitting may be switched from the antenna disposed on the top of the electronic apparatus to the antenna disposed on the bottom of the electronic apparatus. Thus, the radiation by the electronic apparatus to the human body may be reduced.

The present disclosure compensates the detection data of the first electronic component using the reference data collected by the reference wire, effectively improves the accuracy of the detection result of the electronic component having the longer connection wire, and hence improves the operation accuracy of the electronic apparatus operations based on the compensated detection result.

In some embodiments of the present disclosure, the controller obtains the detection data of the second electronic component from the second connection wire, and performs a second operation on the electronic apparatus based on the detection data of the second electronic component.

Because the second connection wire is shorter, i.e., the second electronic component is disposed near the controller, the detection data of the second electronic component obtained by the controller from the second connection wire is less affected (negligible) by the temperature change of the second connection wire, and objectively reflects the actual detection data of the second electronic component. Thus, the temperature compensation is not needed for the detection data of the second electronic component, and the electronic apparatus performs the corresponding operation (the second operation) based directly on the detection result.

In another example, the two electronic components may be two capacitive proximity sensors. Referring to FIG. 1, assuming that the detection result of the capacitive proximity sensor disposed on the bottom of the electronic apparatus indicates the proximity of the human body, the transmit power of the antenna disposed on the bottom of the electronic apparatus may be reduced, or the RF signal transmitting may be switched from the antenna disposed on the bottom of the electronic apparatus to the antenna disposed on the top of the electronic apparatus. Thus, the radiation to the human body may be reduced.

Figure 2:
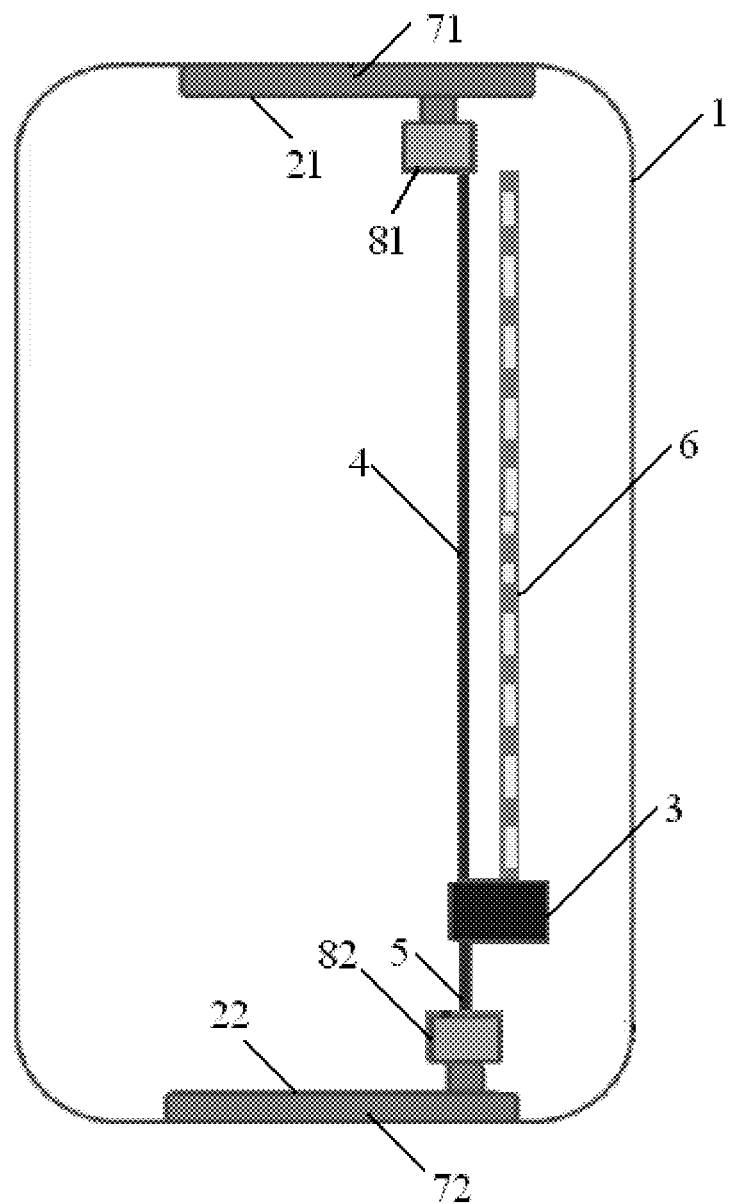
FIG. 2 illustrates a schematic diagram of another example of an electronic apparatus according to some embodiments of the present disclosure.

FIG. 2 illustrates a schematic diagram of another example of an electronic apparatus according to some embodiments of the present disclosure. In embodiment five of the present disclosure, referring to FIG. 2, the electronic apparatus may also include two RF antennae: a first RF antenna 71 and a second RF antenna 72, coupled to the first electronic component and the second electronic component, respectively.

In one example, the first electronic component is disposed on the top of the main body of the electronic apparatus, and the second electronic component is disposed on the bottom of the main body of the electronic apparatus. Accordingly, the first RF antenna is disposed on the top of the main body of the electronic apparatus, and the second RF antenna is disposed on the bottom of the main body of the electronic apparatus.

To save the layout space occupied by the two electronic components and the two RF antennae on the main body of the electronic apparatus and to optimize the component layout on the main body of the electronic apparatus, the design of the first electronic component and the first antenna may be unified. For example, the first electronic component and the first RF antenna may share a same metal plate. Accordingly, the design of the second electronic component and the second antenna may be unified. For example, the second electronic component and the second RF antenna may share a same metal plate.

Because of the unified design of the electronic component and the RF antenna, the unified module (e.g., a first unified module corresponding to the first electronic component and the first RF antenna and a second unified module corresponding to the second electronic component and the second RF antenna) may have mixed signals of the electronic component and the RF antenna, such as the mixed signals of the sensing signal of the capacitive proximity sensor and the antenna signal. Thus, the two signals may be duplexed to effectively separate the respective signals of the electronic component and the RF antenna.

Referring to FIG. 2, the electronic apparatus also includes two signal duplexers: a first signal duplexer 81 and a second signal duplexer 82.

The first signal duplexer 81 may connect between the first unified module and the controller 3 to separate the signal of the first electronic component 21 generated by the first unified module and the signal of the first RF antenna 71, and may at least transmit the separated signal of the first electronic component 21 to the controller 3. The second signal duplexer 82 may connect between the second unified module and the controller 3 to separate the signal of the second electronic component 22 generated by the second unified module and the signal of the second RF antenna 72, and may at least transmit the separated signal of the second electronic component 22 to the controller 3.

Figure 3:
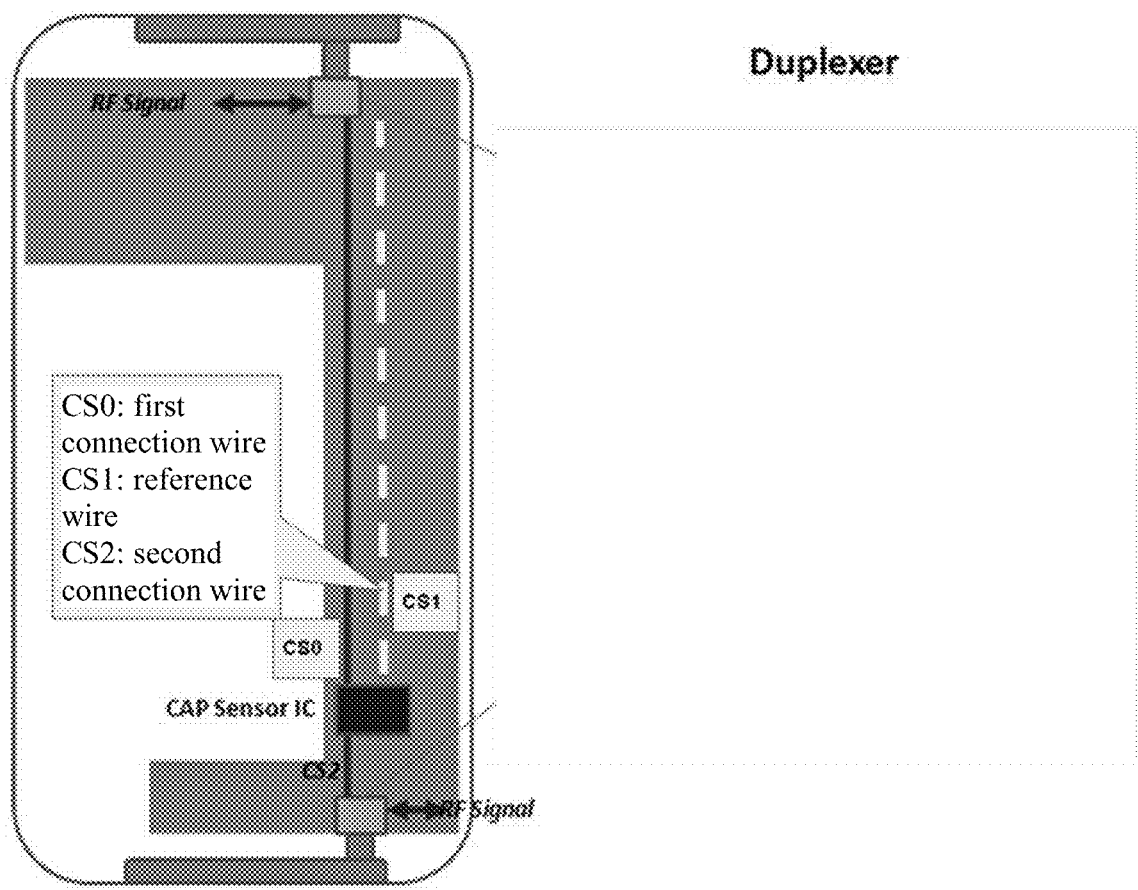
FIG. 3 illustrates a schematic diagram of an example of a signal duplexer according to some embodiments of the present disclosure.

In one example, the two duplexed signals may include the capacitive signal of the capacitive proximity sensor and the RF signal of the antenna. FIG. 3 illustrates a schematic diagram of an example of a signal duplexer according to some embodiments of the present disclosure. As shown in FIG. 3, the duplexer circuit separates the low frequency capacitive signal and the high frequency RF signal.

In another example, the first electronic component and the second electronic component may be two capacitive proximity sensors. The controller may obtain the signals of the two electronic components and process the signals accordingly. Depending on the actual need, the capacitive detection data corresponding to the sensor signals may or may not be compensated. Either the compensated detection result or the uncompensated detection result may be used to perform the pertaining operations.

In various embodiments of the present disclosure, the design of the electronic component and the corresponding antenna may be unified to effectively save the layout space occupied by the two electronic components and the two RF antennae on the electronic apparatus. Thus, the component layout of the main body of the electronic apparatus may be optimized.

The present disclosure provides an information processing method. The method may be suitable for, but is not limited to, a smart phone, a tablet computer, or other electronic apparatus. Before the information processing method in the embodiment of the present disclosure is described, the suitable electronic apparatus is described.

As shown in FIG. 1, the electronic apparatus may include a main body 1, two electronic components 21, 22 having a common function, a controller 3, and a reference wire 6.

The main body 1 may be, but is not limited to, a main body of a smart phone, a tablet computer, or other terminal apparatus. For example, the main body 1 may include at least the main board coupled to a smart phone, a tablet computer, or other terminal apparatus.

The two electronic components 21, 22 having the common function may be coupled to the main body 1 in different positions.

The two electronic components 21, 22 have the common function and may be components designed and operated in pair in the electronic apparatus. For example, the two electronic components 21, 22 may be two capacitive proximity sensors to detect the proximity of the human body. The two electronic components 21, 22 may be two cameras for image acquisition. A camera may be disposed on the top and bottom of the main body 1, respectively, to capture complete face images through both cameras, or to emulate human eyes to capture images with a wider viewing angle. The two electronic components 21, 22 may also be two microphones to capture audio signals. For illustrative purposes, two sensors are used in the description of various embodiments of the present disclosure.

The two electronic components 21, 22 may be disposed at different positions of the main body. For example, one may be disposed on the top and the other may be disposed on the bottom, which is not limited by the present disclosure. In practical applications, the actual positions of the two electronic components 21, 22 may be determined based on the layout requirement in combination with the industrial design of the main body 1.

Coupled to the main body 1, the controller 3 is connected to the first electronic component 21 through the first connection wire 4 and the second electronic component 22 through the second connection wire 5. The first electronic component 21 and the second electronic component 22 are the two electronic components 21, 22. The first connection wire 4 is longer than the second connection wire 5.

In the scenario of paired design and paired application of the electronic components, such as paired sensors (e.g., CAP sensors), paired cameras, or paired microphones in the smart phone or tablet computer, cost optimization and space saving (e.g., main board layout space saving) often result in using one controller to simultaneously control the two electronic components. That is, one controller collects detection data from both electronic components, and performs the respective processing/controlling operations based on the detection data from each electronic component.

In practical applications, after one controller simultaneously connects both electronic components, the controller is often not disposed at the middle position between the two electronic components. For example, the two electronic components are two capacitive proximity sensors. Because of the design of the capacitive proximity sensor, it is desired to keep the connection wires as short as possible in the smart phone. Long connection wires may degrade signal quality due to the temperature change. Thus, the controller is often disposed close to one electronic component to reduce the impact of the temperature change on the connection wires. On the other hand, the controller is disposed distanced from the other electronic component. Accordingly, the connection wire between the controller and the other electronic component is longer. Due to the longer connection wire between the controller and the other electronic component, the connection wire connecting the controller to the other electronic component disposed distanced from the controller may be affected by the temperature change and subject to a certain capacitance effect, thereby lowering the accuracy of the detection data collected by the electronic component through the longer connection wire.

The present disclosure is directed to solve at least the technical problem set forth in the above application scenario involving two electronic components having the common function. In various embodiments of the present disclosure, the electronic apparatus includes a controller and two electronic components connected to the controller. As shown in FIG. 1, the controller 3 connects to the first electronic component 21 through the first connection wire 4 and the second electronic component 22 through the second connection wire 5. The first connection wire 4 is longer than the second connection wire 5.

Referring to FIG. 1, a reference wire 6 is connected to the controller 3. The reference wire 6 is laid-out along a wiring direction of the first connection wire 4, and has a same length as the first connection wire 4. The controller 3 collects reference data through the reference wire 6.

As shown in FIG. 1, to compensate the temperature change of the long connection wire of the electronic component, the present disclosure provides the reference wire 6 laid-out along a wiring direction of the first connection wire 4 and connected to the controller 3. The reference wire 6 has a same length as the first connection wire 4. The reference wire collects the reference data, such as the reference capacitance. Thus, the reference data collected by the reference wire 6 may be processed to provide the temperature compensation to the detection data collected by the first electronic component 21.

Figure 4:
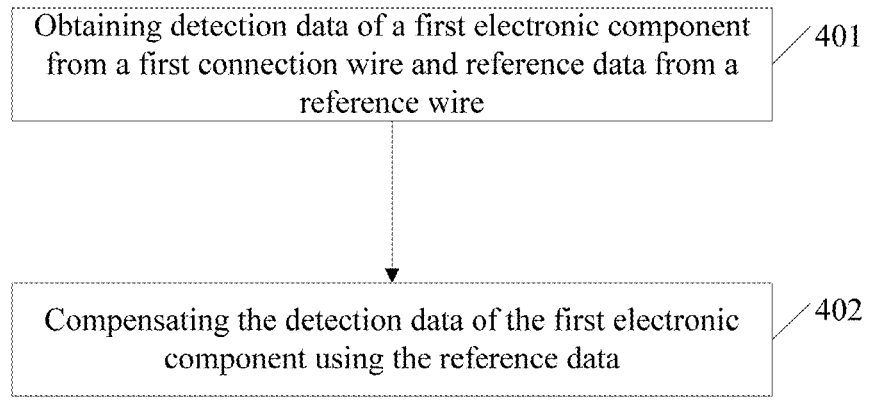
FIG. 4 illustrates a flow chart of an example of an information processing method according to some embodiments of the present disclosure.

FIG. 4 illustrates a flow chart of an example of an information processing method according to some embodiments of the present disclosure. As shown in FIG. 4, the method includes the following process.

The detection data of the first electronic component is obtained from the first connection wire and the reference data is obtained from the reference wire (401).

After the detection data of the first electronic component is obtained from the first connection wire, because the first connection wire is longer, the temperature change may alter the detection data of the first electronic component obtained from the first connection wire, and the data may be temperature compensated accordingly. Thus, the reference data may be obtained from the reference wire at the same time to provide the temperature compensation reference to the detection data of the first electronic component.

The reference data is used to compensate the detection data of the first electronic component (402).

After the detection data of the first electronic component and the reference data are obtained, the reference data may be used to compensate the detection data of the first electronic component. In one example, the two electronic components are two sensors. The reference data collected by the reference wire may be used to provide the temperature compensation to the sensor detection data collected by the sensor having the longer connection wire. In another example, the two electronic components may be two cameras. The reference data collected by the reference wire may be used to provide the temperature compensation to the image detection data collected by the camera having the longer connection wire. In another embodiment, the two electronic components may be two microphones. The reference data collected by the reference wire may be used to provide the temperature compensation to the audio detection data collected by the microphone having the longer connection wire.

In some embodiments, the controller may perform the operations to implement the method of the present disclosure.

Because the present disclosure provides the reference wire laid-out along a wiring direction of the longer connection wire of the electronic component and having a same length as the longer connection wire, the reference data collected by the reference wire may be used to compensate the detection data of the first electronic component to effectively improve the accuracy of the detection result of the electronic component having the longer connection wire.

Figure 5:
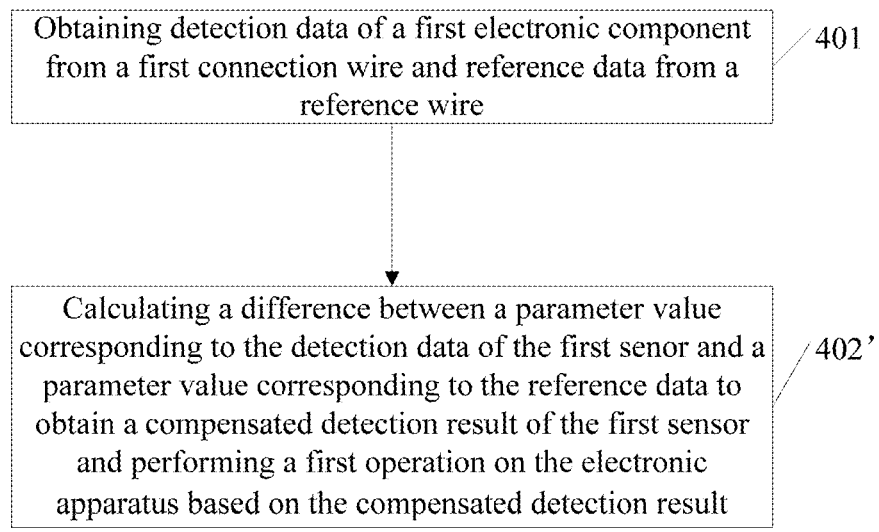
FIG. 5 illustrates a flow chart of an example of another information processing method according to some embodiments of the present disclosure.

In some embodiments, the two electronic components may be two sensors. The first electronic component may be a first sensor, and the second electronic component may be a second sensor. FIG. 5 illustrates a flow chart of an example of another information processing method according to some embodiments of the present disclosure. As shown in FIG. 5, the method includes a 402' in place of the 402.

A difference between the parameter value corresponding to the detection data of the first senor and the parameter value corresponding to the reference data may be calculated to obtain the compensated detection result of the first sensor and to perform a first operation on the electronic apparatus based on the compensated detection result (402').

After the controller obtains the detection data of the first electronic component from the first connection wire, the detection data may include two portions: the detection data collected by the first electronic component and the noise data collected by the reference wire. The detection data is a result of mixing the two portions. Because the extra reference wire collects the reference data consistent with the noise data collected by the first connection wire, the controller may calculate the difference between the value of the detection data (including the noise data) of the first electronic component and the value of the reference data to compensate the detection data of the first electronic component obtained by the controller. The compensated detection result may be the actual detection data of the first electronic component.

For illustrative purposes, in one example, the two electronic components may be two sensors. Assuming that the first electronic component includes a first sensor and the second electronic component includes a second sensor, the controller may obtain the capacitance value corresponding to the capacitance data (including noise) of the first sensor and the capacitance value corresponding to the reference data, calculate a difference, and obtain the compensated capacitance value of the first sensor. Thus, the accuracy of the detection result of the electronic component having the longer connection wire may be effectively improved. The controller may perform the corresponding operation (the first operation) on the electronic apparatus based on the substantially accurate compensated detection result.

In another example, the two electronic components may be two capacitive proximity sensors. The compensated sensor capacitance value may be used to detect the proximity of the human body. After it is determined that the human body is in the proximity of the electronic apparatus, the transmit power of the RF antenna corresponding to the sensor may be reduced (to a permissible range), or the RF signal may be transmitted by switching to the antenna distanced from the human body. In another example, as shown in FIG. 1, assuming that the compensated detection result of the capacitive proximity sensor disposed on the top of the electronic apparatus indicates the proximity of the human body, the transmit power of the antenna disposed on the top of the electronic apparatus may be reduced, or the RF signal transmitting may be switched from the antenna disposed on the top of the electronic apparatus to the antenna disposed on the bottom of the electronic apparatus. Thus, the radiation by the electronic apparatus to the human body may be reduced.

The present disclosure compensates the detection data of the first electronic component using the reference data collected by the reference wire, effectively improves the accuracy of the detection result of the electronic component having the longer connection wire, and hence improves the operation accuracy of the electronic apparatus operations based on the compensated detection result.

Figure 6:
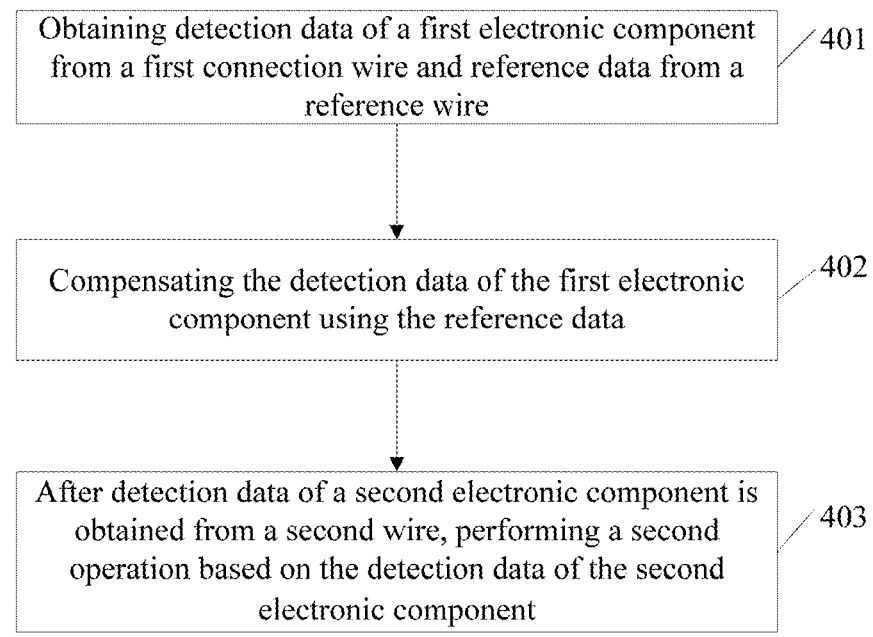
FIG. 6 illustrates a flow chart of an example of another information processing method according to some embodiments of the present disclosure.

FIG. 6 illustrates a flow chart of an example of another information processing method according to some embodiments of the present disclosure. In embodiment eight of the present disclosure, as shown in FIG. 6, the method includes a 403 in addition to the 401 and the 402.

After the detection data of the second electronic component is obtained from the second connection wire, the electronic apparatus performs a second operation based on the detection data of the second electronic component (403).

Because the second connection wire is shorter, i.e., the second electronic component is disposed near the controller, the detection data of the second electronic component obtained by the controller from the second connection wire is less affected (negligible) by the temperature change of the second connection wire, and objectively reflects the actual detection data of the second electronic component. Thus, the temperature compensation is not needed for the detection data of the second electronic component, and the electronic apparatus performs the corresponding operation (the second operation) based directly on the detection result.

In another example, the two electronic components may be two capacitive proximity sensors. Referring to FIG. 1, assuming that the detection result of the capacitive proximity sensor disposed on the bottom of the electronic apparatus indicates the proximity of the human body, the transmit power of the antenna disposed on the bottom of the electronic apparatus may be reduced, or the RF signal transmitting may be switched from the antenna disposed on the bottom of the electronic apparatus to the antenna disposed on the top of the electronic apparatus. Thus, the radiation to the human body may be reduced.

In some embodiments, referring to FIG. 2, the electronic apparatus may also include two RF antennae 71, 72: a first RF antenna 71 and a second RF antenna 72, coupled to the first electronic component and the second electronic component, respectively.

In one example, the first electronic component is disposed on the top of the main body of the electronic apparatus, and the second electronic component is disposed on the bottom of the main body of the electronic apparatus. Accordingly, the first RF antenna is disposed on the top of the main body of the electronic apparatus, and the second RF antenna is disposed on the bottom of the main body of the electronic apparatus.

To save the layout space occupied by the two electronic components and the two RF antennae on the main body of the electronic apparatus and to optimize the component layout on the main body of the electronic apparatus, the design of the first electronic component and the first antenna may be unified. For example, the first electronic component and the first RF antenna may share a same metal plate. Accordingly, the design of the second electronic component and the second antenna may be unified. For example, the second electronic component and the second RF antenna may share a same metal plate.

Because of the unified design of the electronic component and the RF antenna, the unified module (e.g., a first unified module corresponding to the first electronic component and the first RF antenna and a second unified module corresponding to the second electronic component and the second RF antenna) may have mixed signals of the electronic component and the RF antenna, such as the mixed signals of the sensing signal of the capacitive proximity sensor and the antenna signal. Thus, the two signals may be duplexed to effectively separate the respective signals of the electronic component and the RF antenna.

Figure 7:
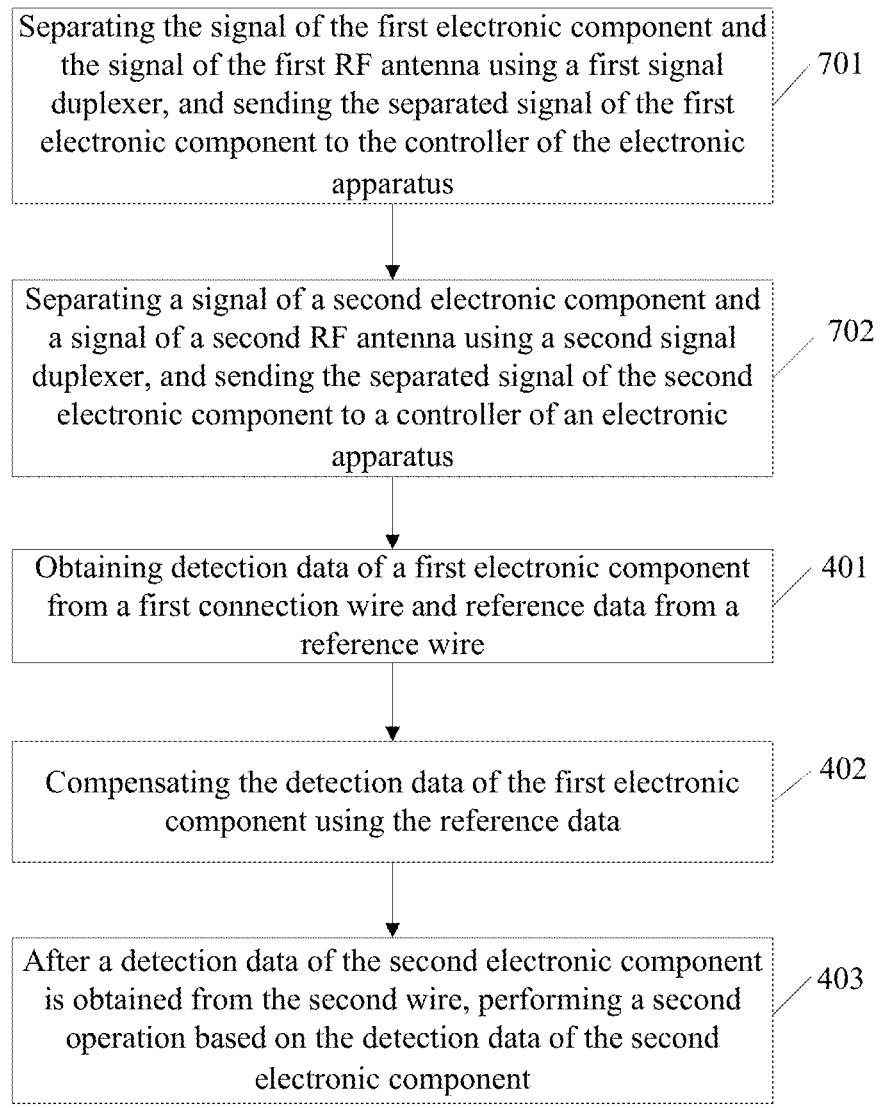
FIG. 7 illustrates a flow chart of an example of another information processing method according to some embodiments of the present disclosure.

FIG. 7 illustrates a flow chart of an example of another information processing method according to some embodiments of the present disclosure. As shown in FIG. 7, the method includes the following processes before the 401.

A first signal duplexer is used to separate the signal of the first electronic component and the signal of the first RF antenna. The separated signal of the first electronic component is sent to the controller of the electronic apparatus. The first signal diplexer connects between the first unified module and the controller (701).

A second signal duplexer is used to separate the signal of the second electronic component and the signal of the second RF antenna. The separated signal of the second electronic component is sent to the controller of the electronic apparatus. The second signal diplexer connects between the second unified module and the controller (702).

In one example, the two duplexed signals may include the capacitive signal of the capacitive proximity sensor and the RF signal of the antenna. As shown in FIG. 3, the duplexer circuit separates the low frequency capacitive signal and the high frequency RF signal.

In another example, the first electronic component and the second electronic component may be two capacitive proximity sensors. The controller may obtain the signals of the two electronic components and process the signals accordingly. Depending on the actual need, the capacitive detection data corresponding to the sensor signals may or may not be compensated. Either the compensated detection result or the uncompensated detection result may be used to perform the pertaining operations.

In various embodiments of the present disclosure, the design of the electronic component and the corresponding antenna may be unified to effectively save the layout space occupied by the two electronic components and the two RF antennae on the electronic apparatus. Thus, the component layout of the main body of the electronic apparatus may be optimized.

Because the present disclosure provides the reference wire laid-out along a wiring direction of the longer connection wire of the electronic component and having a same length as the longer connection wire, the reference data collected by the reference wire may be used to compensate the detection data of the first electronic component to effectively improve the accuracy of the detection result of the electronic component having the longer connection wire.

The embodiments disclosed in the present disclosure may be described in a progressive manner. The description of each embodiment may focus on the differentiation as compared to other embodiments. Similarities between various embodiments may be referenced.

For the convenience of description, the system or apparatus is described in terms of the functions divided into various modules or units. Of course, the function of individual units may be implemented in the same software, the different software, or the software and/or the hardware.

It can be known from the description of the above embodiments that those skilled in the art can clearly understand that the present disclosure can be implemented in the software on the general purpose hardware platform. Based on this understanding, the present disclosure may be embodied in the form of computer software product. The computer software product may be stored in a storage medium, such as ROM/RAM, magnetic disk, or optical disk, etc. The computer software product may include instructions for a computer equipment (e.g., a personal computer, a server, or a network equipment, etc.) to implement the methods of various embodiments of the present disclosure.

Finally, it should be noted that relational terms such as first, second, third, and fourth, etc. are only used to distinguish one entity or operation from another entity or operation, and do not necessarily require or imply the actual order or sequence of the entities or operations. Moreover, the terms such as "comprise", "include", or other variations are intended to cover a non-exclusive inclusion, such that a process, method, article, or apparatus that comprises a list of elements includes not only those elements but also includes those not explicitly listed or other elements inherent to such a process, method, article, or apparatus. Without further limitations, the element defined by the sentence "includes a . . . " does not exclude additional same elements in the process, method, article, or apparatus.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. An electronic apparatus, comprising:
a main body;
a first electronic component and a second electronic component having a common function and disposed at different positions in relation to the main body, wherein the first electronic component including a first sensor receiving a first detection signal and a first duplexer generating a first detection data based on the first detection signal and the second electronic component including a second sensor receiving a second detection signal and a second duplexer generating a second detection data based on the second detection signal;
a controller, disposed in relation to the main body, the controller being connected to the first electronic component through a first connection wire and the controller also being connected to the second electronic component through a second connection wire, the first connection wire having a length longer than the second connection wire; and
a reference wire, connected to the controller, in order to provide reference data corresponding to the first connection wire to the controller,
wherein the controller is configured to adjust the first detection data received from the first electronic component via the first connection wire, based on the reference data of the reference wire.

2. The apparatus according to claim 1, wherein:
the reference wire is laid out along a wiring direction of the first connection wire and having a same length as the first connection wire.

3. The apparatus according to claim 1, wherein:
the reference wire has one end connected to the controller and an opposite free end.

4. The apparatus according to claim 1, wherein:
the reference wire is laid-out in parallel with the first connection wire.

5. The apparatus according to claim 1, wherein:
the reference wire is not directly connected to the first and second electronic components.

6. The apparatus according to claim 1, wherein the controller is configured to:
obtain the first detection data of the first electronic component from the first connection wire,
obtain the reference data from the reference wire, and
compensate to adjust the first detection data of the first electronic component using the reference data.

7. The apparatus according to claim 6, wherein:
to compensate the first detection data using the reference data, the controller is configured to calculate a difference between a parameter value corresponding to the first detection data and a parameter value corresponding to the reference data to obtain a compensated detection result of the first sensor, and perform a first operation on the electronic apparatus based on the compensated detection result.

8. The apparatus according to claim 1, wherein the controller is further configured to:
obtain a second detection data of the second electronic component from the second connection wire; and
perform a second operation on the electronic apparatus based on the second detection data of the second electronic component.

9. The apparatus according to claim 1, wherein the first detection data is separated by the first duplexer based on the first detection signal, and the second detection data is separated by the second duplexer based on the second detection signal.

10. The apparatus according to claim 9, further comprises a first RF device generating a first RF signal, a second RF device generating a second RF signal, the first duplexer is configured to separate the first detection data from the first RF signal and generate the first detection data, and the second duplexer is configured to separate the second detection data from the second RF signal and generate the second detection data.

11. An information processing method, comprising:
coupling a first sensor with a first duplexer in a first electronic component, and coupling a second sensor with a second duplexer in a second electronic component;
receiving a first detection signal by the first sensor and generating a first detection data based on the first detection signal by the first duplexer, receiving a second detecting signal, if available, by the second sensor, and generating a second detection data based on the second detection signal;

connecting the first electronic component to a controller through a first connection wire and connecting the second electronic component to the controller through a second connection wire, the first connection wire having a length longer than the second connection wire;

connecting a reference wire to the controller, in order to provide reference data corresponding to the first connection wire to the controller;

obtaining, by the controller, a first detection data from the first electronic component through the first connection wire; and adjusting, by the controller, the first detection data received from the first electronic component using the reference data of the reference wire.

12. The method according to claim 11, further comprising:

laying out the reference wire along a wiring direction of the first connection wire, wherein the reference wire has a same length as the first connection wire.

13. The method according to claim 11, wherein:

adjusting the first detection data includes compensating, by the controller, the first detection data of the first electronic component using the reference data, comprising:

calculating a difference between a parameter value corresponding to the first detection data of the first sensor and a parameter value corresponding to the reference data to obtain a compensated detection result of the first sensor, and performing a first operation on the electronic apparatus based on the compensated detection result.

14. The method according to claim 11, further comprising:

obtaining, by the controller, second detection data of the second electronic component from the second connection wire; and performing, by the controller, a second operation on the electronic apparatus based on the second detection data of the second electronic component.

15. The method according to claim 11, wherein:

the reference wire has one end connected to the controller and an opposite free end.

16. The method according to claim 11, wherein:

the reference wire is laid-out in parallel with the first connection wire.

17. The method according to claim 11, wherein:

the reference wire is not connected to the first and second electronic components.

18. The method according to claim 11, wherein the first detection data is separated by the first duplexer based on the first detection data and the second detection data is separated by the second duplexer based on the second detection data.

19. The method according to claim 18, further comprising coupling a first RF device to generate a first RF signal, coupling a second RF device to generate a second RF signal, separating the first detection signal from the first RF signal and generating the first detection data, separating the second detection data from the second RF signal and generating the second detection data.

* * * * *